US011137310B2

(12) United States Patent
White et al.

(10) Patent No.: US 11,137,310 B2
(45) Date of Patent: Oct. 5, 2021

(54) MICRO-HALL EFFECT DEVICES FOR SIMULTANEOUS CURRENT AND TEMPERATURE MEASUREMENTS FOR BOTH HIGH AND LOW TEMPERATURE ENVIRONMENTS

(71) Applicants: Thomas P. White, Lubbock, TX (US); Satish Shetty, Fayetteville, AR (US); Morgan E. Ware, Fayetteville, AR (US); H. Alan Mantooth, Fayetteville, AR (US); Gregory J. Salamo, Fayetteville, AR (US)

(72) Inventors: Thomas P. White, Lubbock, TX (US); Satish Shetty, Fayetteville, AR (US); Morgan E. Ware, Fayetteville, AR (US); H. Alan Mantooth, Fayetteville, AR (US); Gregory J. Salamo, Fayetteville, AR (US)

( * ) Notice: Subject to any disclaimer, the term of this patent is extended or adjusted under 35 U.S.C. 154(b) by 356 days.

(21) Appl. No.: 16/161,260

(22) Filed: Oct. 16, 2018

(65) Prior Publication Data

US 2019/0120712 A1 Apr. 25, 2019

Related U.S. Application Data

(60) Provisional application No. 62/572,981, filed on Oct. 16, 2017.

(51) Int. Cl.
*G01L 19/00* (2006.01)
*G01R 33/07* (2006.01)
*G01K 7/36* (2006.01)
*G01R 15/20* (2006.01)

(52) U.S. Cl.
CPC ............ *G01L 19/0092* (2013.01); *G01K 7/36* (2013.01); *G01R 15/202* (2013.01); *G01R 33/07* (2013.01)

(58) Field of Classification Search
CPC ......... G01R 33/07; G01R 15/202; G01K 7/36
See application file for complete search history.

(56) References Cited

U.S. PATENT DOCUMENTS

| 6,902,820 | B2 | 6/2005 | Huybrechts et al. | 324/251 |
| 8,129,725 | B2 | 3/2012 | Kunze et al. | 257/76 |
| 8,449,180 | B2 | 5/2013 | Sandhu et al. | 374/185 |
| 8,546,817 | B2 | 10/2013 | Dumitru et al. | 257/79 |
| 9,164,153 | B2 | 10/2015 | Kosel et al. | 257/425 |
| 9,714,988 | B2 | 7/2017 | Eckinger et al. | 33/72 |
| 9,857,437 | B2 | 1/2018 | Taylor et al. | 33/7 |
| 2004/0155260 | A1* | 8/2004 | Kuzmik | H01L 29/7786 257/192 |
| 2006/0261370 | A1* | 11/2006 | Hoke | H01L 29/7785 257/194 |

(Continued)

FOREIGN PATENT DOCUMENTS

| EP | 1720026 A1 | 3/2006 | 33/6 |
| EP | 1720026 B1 | 3/2006 | 33/6 |

(Continued)

*Primary Examiner* — Alvaro E Fortich
(74) *Attorney, Agent, or Firm* — Keisling & Pieper PLC; David B. Pieper; Trent C. Keisling (57) ABSTRACT

GaN/Al$_{0.20}$Ga$_{0.80}$N/GaN heterostructures Micro-Hall effect sensors providing simultaneous current and temperature detection over at least a best performance temperature range of −183° C. and 252° C.

33 Claims, 11 Drawing Sheets

(56) References Cited

U.S. PATENT DOCUMENTS

| | | | |
|---|---|---|---|
| 2007/0046287 A1 | 3/2007 | Vervaeke et al. | 324/251 |
| 2007/0176211 A1* | 8/2007 | Kunze | G01L 1/2293 257/232 |
| 2007/0257659 A1* | 11/2007 | Nomoto | G01R 15/202 324/76.11 |
| 2007/0278518 A1* | 12/2007 | Chen | H01L 29/7787 257/192 |
| 2008/0074106 A1* | 3/2008 | Oohira | G01R 33/07 324/209 |
| 2010/0133547 A1 | 6/2010 | Kunze et al. | 257/76 |
| 2010/0226409 A1* | 9/2010 | Sandhu | G01K 7/40 374/185 |
| 2012/0038356 A1 | 2/2012 | Kosel et al. | 324/251 |
| 2012/0161147 A1 | 6/2012 | Dumitru et al. | 257/76 |
| 2013/0204564 A1* | 8/2013 | Moore | G01D 18/00 702/86 |
| 2014/0084913 A1 | 3/2014 | Kosel et al. | 324/252 |
| 2016/0124055 A1* | 5/2016 | Ausserlechner | G01R 33/075 324/251 |
| 2017/0038439 A9 | 2/2017 | Kosel et al. | 324/252 |
| 2017/0082662 A1* | 3/2017 | Spiegel | G01R 15/202 |

FOREIGN PATENT DOCUMENTS

| | | | |
|---|---|---|---|
| EP | 2461145 A1 | 1/2010 | |
| EP | 2461145 B1 | 1/2010 | |
| JP | 2009 505045 | 2/2009 | 27/414 |
| JP | 2009 524798 | 7/2009 | 7/16 |
| JP | 2012 198250 | 10/2012 | 27/414 |
| JP | 5119450 | 11/2012 | 7/22 |
| WO | WO 2007/017252 A1 | 2/2007 | 27/414 |
| WO | WO 2007/086238 A1 | 8/2007 | 7/22 |
| WO | WO 2012/010979 A2 | 1/2012 | |
| WO | WO 2012/010979 A3 | 1/2012 | |

* cited by examiner

MICRO-HALL EFFECT DEVICES FOR SIMULTANEOUS CURRENT AND TEMPERATURE MEASUREMENTS FOR BOTH HIGH AND LOW TEMPERATURE ENVIRONMENTS

CROSS-REFERENCE TO RELATED APPLICATIONS

This application claims priority to and is a continuation-in-part of U.S. Provisional Application Ser. No. 62/572,981 filed on Oct. 16, 2017. Each of these prior applications is incorporated by reference in their entirety.

STATEMENT REGARDING FEDERALLY SPONSORED RESEARCH OR DEVELOPMENT

This invention was made with government support by the NSF Engineering Research center for Power Optimization of Electro Thermal Systems (POETS). EEC-1449548. The government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in hall effect sensors. More particularly, the invention relates to improvements particularly suited for a wide temperature range where simultaneous current and temperature readings are desirable. In particular, the present invention relates specifically to a GaN/Al$_{0.20}$Ga$_{0.80}$N/GaN micro hall effect sensor.

2. Description of the Known Art

As will be appreciated by those skilled in the art, hall effect sensors are known in various forms. Patents disclosing information relevant to hall effect sensors include: U.S. Pat. No. 9,857,437, issued to Taylor, et al. on Jan. 2, 2018 entitled Hall effect sensing element; and U.S. Pat. No. 9,714,988, issued to Eckinger, et al. on Jul. 25, 2017 entitled Hall effect sensor with graphene detection layer. Each of these patents is hereby expressly incorporated by reference in their entirety.

The recent development in III-nitride materials, and their unique intrinsic properties has drawn considerable attention for the development of power devices that operate in high temperature, high power, and high frequency regimes. Despite the outstanding properties of III-nitride based high electron mobility transistors (HEMTs) which allow for modern power systems to be designed at much higher power densities, system durability is reduced due to the presence of variable operating conditions such as temperature, radiation, bias, etc. To combat such fluctuations, systems must monitor real time current load and temperature of active circuit components by adding external parasitic devices, i.e. shunt resistors. The parasitic power dissipated within the resistor, unfortunately, reduces the achievable power density and efficiency of the electrical system. The ability to control and monitor the circuit current while at the same time reroute the heat to prevent failure without the cost of high power dissipation would be a great benefit to circuit designers.

The conventional semiconductor based Hall sensor has an intrinsic limitation in the high temperature regime due to an inherent high carrier growth that degrades the sensitivity of the device. To demonstrate, high sensitivity, robust sensors and high temperature operation, AlGaN/GaN hetero-structure based Micro-Hall sensors are an improved choice due to its formation of 2D electron gas and wide band gap. These micro-Hall sensors exhibit high signal linearity and high magnetic field sensitivity. However, the unavoidable parasitic voltage developed at zero magnetic field (referred to as the offset voltage) limits the ability of the sensor to detect low magnetic fields. Many attempts have been made to reduce the offset voltage by employing external analog circuits, resistance bridges, or rotating contacts.

From these prior references it may be seen that these prior art patents are very limited in their teaching and utilization, and an improved hall effect sensor is needed to overcome these limitations.

SUMMARY OF THE INVENTION

The present invention is directed to an improved hall effect sensors using AlGaN/GaN micro-Hall effect sensors that allow for DC/AC (Direct Current, Alternating Current) current detecting while at the same time achieving circuit isolation.

In another improvement, the present invention provides methods to determine current and temperature by understanding and separating the offset voltage from the Hall voltage.

In a further improvement, the present invention provides a high sensitivity Hall effect simultaneous current and temperature sensor. The sensor is capable of operating in high and low temperature environments.

In yet another improvement, the present invention provides sensors that may operate in a high temperature environment, over a wide temperature range, measures temperature and current simultaneously, can be integrated directly onto a transistor, is smaller size and has a high sensitivity.

In another improvement, the present invention provides devices that may function as a current sensor, temperature sensor, pressure sensor, simultaneous current, pressure, and temperature sensor, or a feedback system to protect or enhance electronic circuits or devices and inverters/convertors.

In other embodiments, the present invention provides sensors where Al$_{0.20}$Ga$_{0.80}$N/GaN heterostructures were grown and fabricated as micro-Hall devices. Highly linear Hall voltage behavior was shown as functions of both temperature and bias conditions. The voltage and magnetic field sensitivity were characterized in the temperature −183° C. (Celcius) to −252° C. These sensors demonstrate a SCRS (supply-current-related sensitivity) of 113 VA$^{-1}$T$^{-1}$ (Volt per Amp per Temperature) and 80 VA$^{-1}$T$^{-1}$ at (Room Temperature) and 252° C., respectively. These micro-Hall devices have been tested at temperatures as high has 300° C. while the Al$_{0.20}$Ga$_{0.80}$N/GaN structures have been thermally cycled to 900° C. The devices and structures remain operational after these anneals.

In other embodiments, the present invention provides a method to separate the offset voltage from the Hall voltage using two distinct voltage measurements and their predetermined measurements as a function of temperature. The process of removing the offset voltage allows for the simultaneous and simple measurement of both current and temperature.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

As shown in FIGS. 1-11 of the drawings, one exemplary embodiment of the present invention is generally shown. In a preferred embodiment, AlGaN/GaN heterostructures were grown using a nitrogen plasma assisted Veeco Gen II MBE system and consisted of a 1.5 µm GaN buffer, a 20 nm AlGaN barrier, and a 5 nm GaN cap (FIG. 1a) which were deposited on top of a sapphire substrate with a 5 µm thick, Fe doped, semi-insulating (SI), hydride vapor phase epitaxial (HYPE) grown GaN template commercially deposited on it. The growth temperature for each layer was 796° C. The radio frequency plasma power was maintained at 350 W with a nitrogen flow rate of 0.50 sccm corresponding to a 4 nm/min deposition rate. The Ga:N flux ratio was maintained at 1.02 during the growth of the GaN layers, while during the AlGaN deposition the (Al+Ga):N flux ratio was held at 1.00. The chamber pressure remained stable at 3.25×10-6 Torr throughout the growth process. For this technology, 20% of Al was incorporated to form the AlGaN barrier layer (Al$_{0.20}$Ga$_{0.80}$N). The surface morphology, percentage of Al composition and structural properties have been investigated by AFM and high-resolution x-ray diffraction (HRXRD), respectively.

Figure 1:
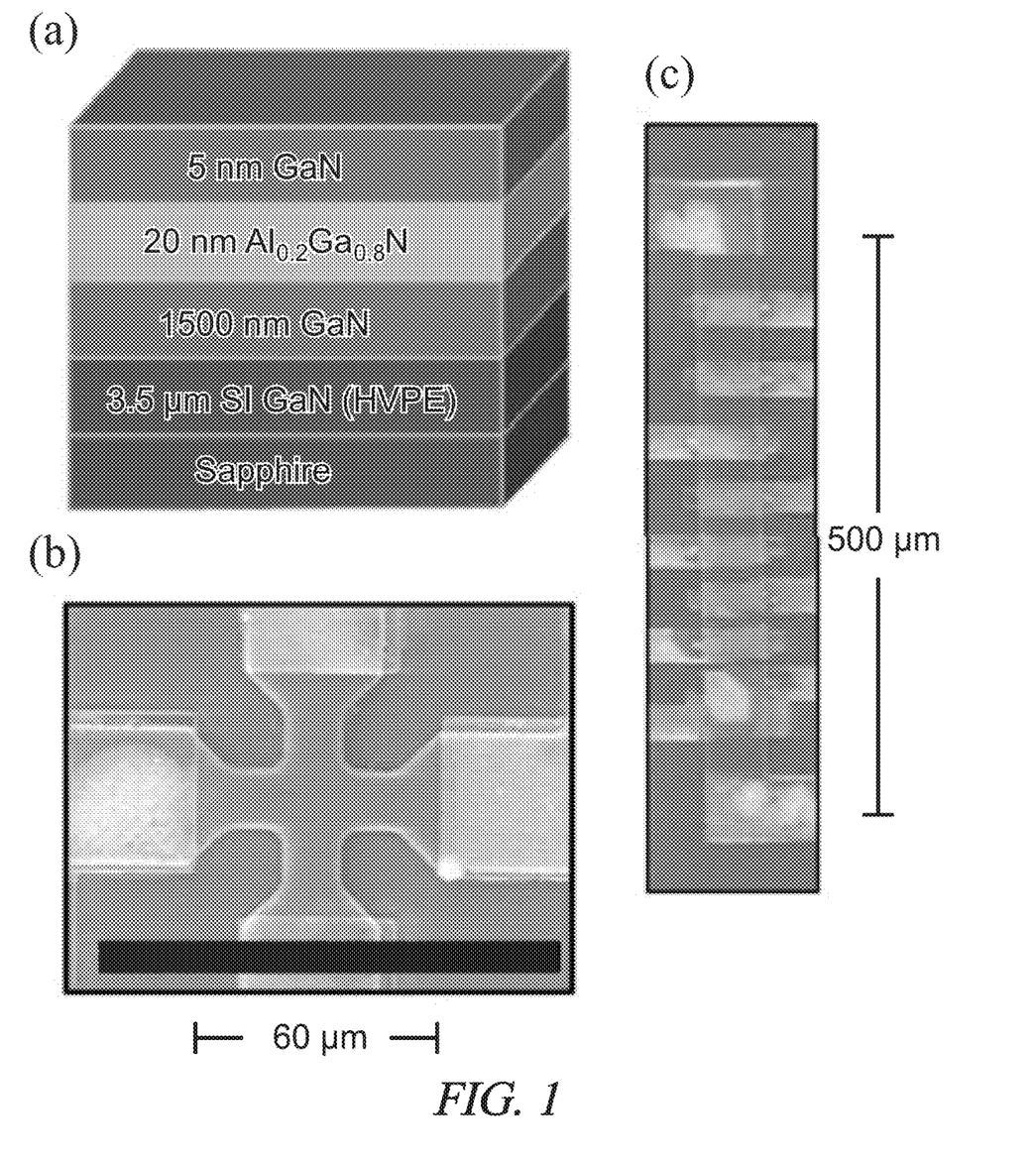
FIG. 1. (a) Cross-sectional diagram of AlGaN/GaN micro-Hall devices. SEM image of a (b) Greek-Cross and (c) TLM structure as fabricated.

After removal from the MBE chamber, the sample was rinsed in an HCl bath in order to remove excess Ga from the surface (no annealing was administered during growth to surface). In order to form the Greek-cross and transmission line model (TLM) structures, a Cl-based ICP dry etch was used. The ohmic contacts were formed with a Ti (25 nm)/Al (100 nm)/Ni (50 nm)/Au (300 nm) metal stack deposited by e-beam evaporation and subsequent annealing was carried out by a rapid thermal anneal at 800° C. for 30 s to enhance diffusion. A 150 nm SiO2 surface passivation layer was then deposited by plasma-enhanced chemical vapor deposition (PECVD). The SiO2 was removed from the contacts with a BOE 5:1 wet etch and the sample was then diced into 3 mm×3 mm squares containing two Greek-cross Hall effect sensors (FIG. 1b) and one TLM structure (FIG. 1c). Hall effect and offset voltage measurements as a function of magnetic field, biasing condition, and temperature were performed on the AlGaN/GaN device using an MMR Hall measurement system.

In order for the Hall sensors to be operated in high power electronics, the tradeoff between magnetic field sensitivity, temperature stability, and high temperature operation (≥200° C.) were considered. This is due to the large temperature ranges expected due to Joule heating as current is pulsed within a power module. The AlGaN/GaN micro-Hall sensor sensitivity and the corresponding temperature dependency is described in detail below.

AlGaN/GaN Structure Properties

The output Hall voltage of a Hall effect device is dependent on the drift velocity of carriers and thus dependent on the carrier mobility and density as shown in the equations below. The Hall voltage can be written as $$V_H = v_d BW \quad (1)$$

where $V_H$ is the Hall voltage, $v_d$ is the drift velocity, B is the magnetic field applied perpendicular to the plane of the device, and W is the width of the etched material, i.e., the conductive channel. The geometrical correction factor and offset voltage (see below) have been excluded from Eq. 1 as they do not add to this discussion. The drift velocity can be written as $$v_d = \mu E_A \quad (2)$$

which, for a given applied current, is:

$$v_d = \frac{I_A}{Aqn} \quad (3)$$

where μ is the carrier mobility, $E_A$ is the applied electric field, $I_A$ is the applied current, A is the cross-sectional area, q is the elemental charge, and n is the three-dimensional electron concentration.

Figure 2:
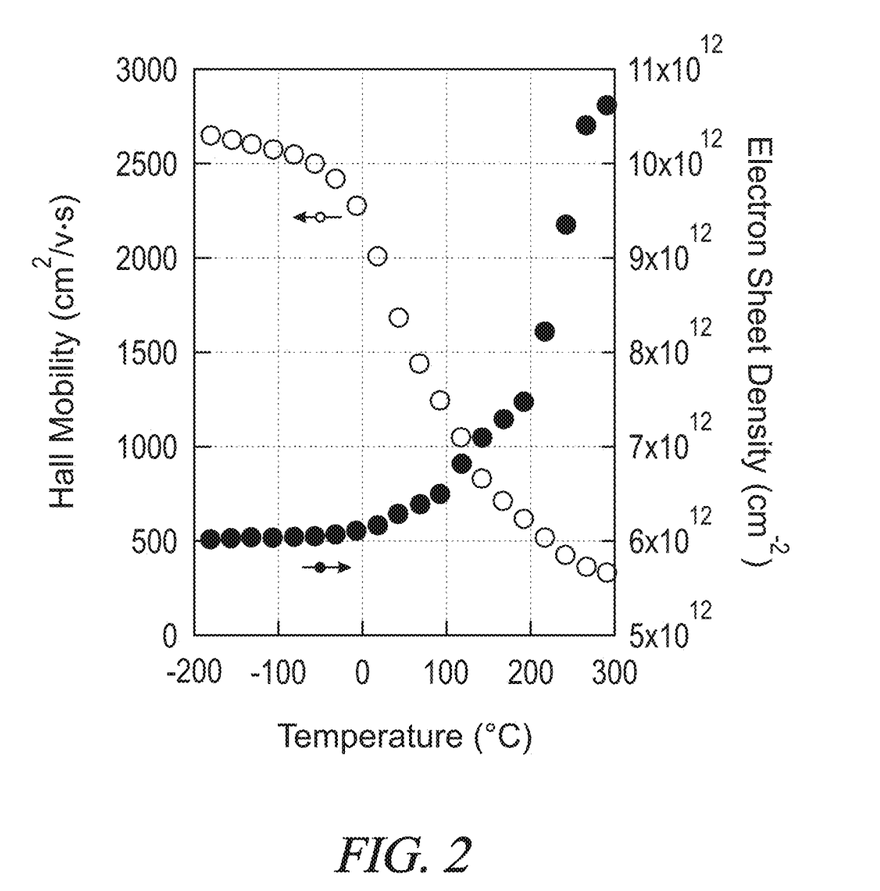
FIG. 2. Hall mobility and electron sheet density for an AlGaN/GaN heterostructure as a function of temperature.

As seen in Eq. 2, a high charge carrier mobility is necessary to achieve a higher carrier drift velocity. Meanwhile for a given current a low charge density is desired. The room temperature (RT) electron mobility and sheet density achieved in the AlGaN/GaN heterostructure growth was 2000 cm2/Vs (centimeter squared/volt second) and 6.1× 1012 cm-2, respectively as shown in FIG. 2.

Micro-Hall Device Output Signal Linearity

Figure 3:
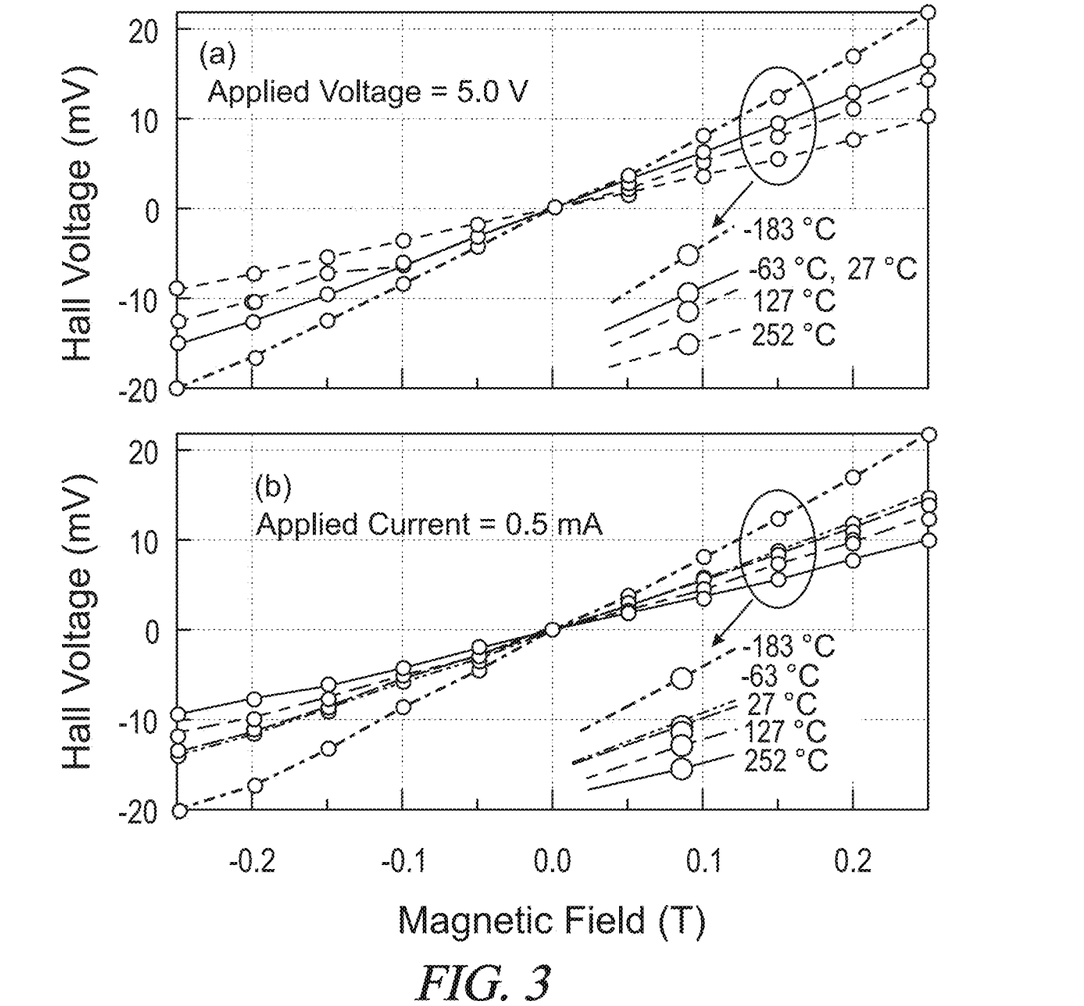
FIG. 3. Hall voltage as a function of magnetic field and temperature for the AlGaN/GaN micro-Hall device.

As shown by Eq. 1, a Hall sensor should have a linear response to a changing magnetic field. The Hall sensor can be operated by either a constant applied voltage (electric field) or constant applied current. Additionally, for a practical sensor, the Hall voltage/magnetic field relationship must remain linear over a wide temperature range as well. FIG. 3 shows this relationship for the Hall effect sensor when biased using either a constant current or a constant voltage. The AlGaN/GaN device has a linear response to magnetic fields in the range of −0.2.5 T to 0.25 T throughout the temperature range of −183° C. (Celcius) to 250° C. The offset voltage has been removed from the data presented in FIG. 3 to emphasize output linearity.

Figure 4:
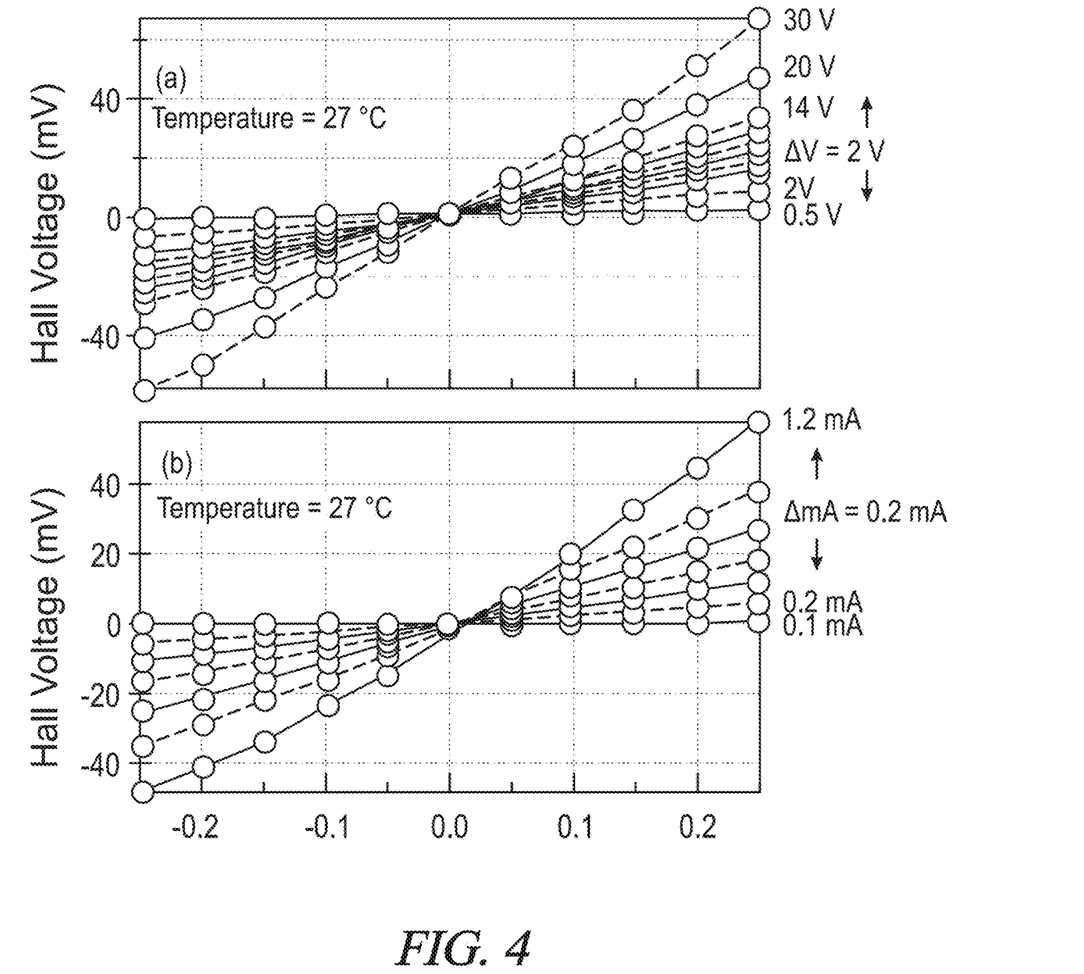
FIG. 4. Hall voltage as a function of magnetic field and (a) constant voltage and (b) constant current bias conditions for the AlGaN/5 GaN micro-Hall device.

The device was tested as a function magnetic field under both constant voltage and constant current biasing conditions. FIG. 4 shows the linear relationship of the Hall voltage and magnetic field while the sensor is biased with a voltage in the range of 0.5 V-20 V (FIG. 4a) or biased with a current in the range of 0.1 mA-1.0 mA (FIG. 4b). Additionally, the device was tested up to 50 V and 2.0 A (not shown here) and remained operational. However, the Hall voltage was no longer linear with respect to the changing magnetic field at 50 V.

Temperature Dependence of Micro-Hall Device Hall Voltage and Sensitivity

As previously described, the Hall voltage is drift velocity dependent and thus temperature dependent. If Eqs. 2 and 3 are inserted into Eq. 1 then the Hall voltage becomes $$V_H = \mu E_A BW \quad (4)$$

or $$V_H = \frac{I_A}{Aqn} BW. \quad (5)$$

Figure 5:
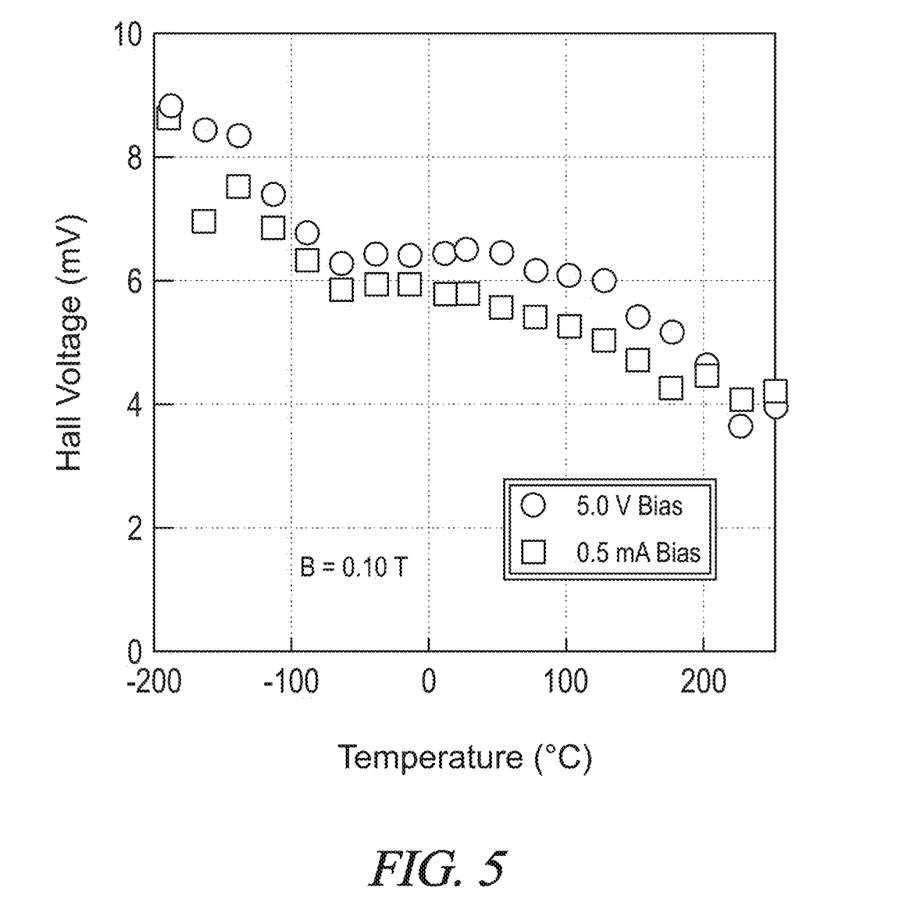
FIG. 5. Hall voltage as a function of temperature.

FIG. 5 shows the Hall voltage for a sensor of the present invention at a fixed 100 mT magnetic field for both constant voltage and constant current control as a function of temperature. The bias conditions of 5 V and 0.5 mA are approximately equal due to a total sample resistance of 10 kΩ at −183° C.

Device sensitivity can be calculated from data shown in FIG. 3 and is given by $$S_A = \frac{\Delta V_H}{\Delta B}. \quad (6)$$

For the data presented in FIG. 3, ΔB is the same. Thus, $S_A(T) \sim V_H(T) \sim v_d(T)$. In other words, device sensitivity will follow the Hall voltage-temperature relationship under constant magnetic field and bias. Therefore, sensitivity will behave like the data shown in FIG. 5. The sensitivity for these micro-Hall devices are between 30 μV/T and 60 μV/T at RT which is compares favorably to published sensitivities of high temperature Hall effect sensors.

Figure 6:
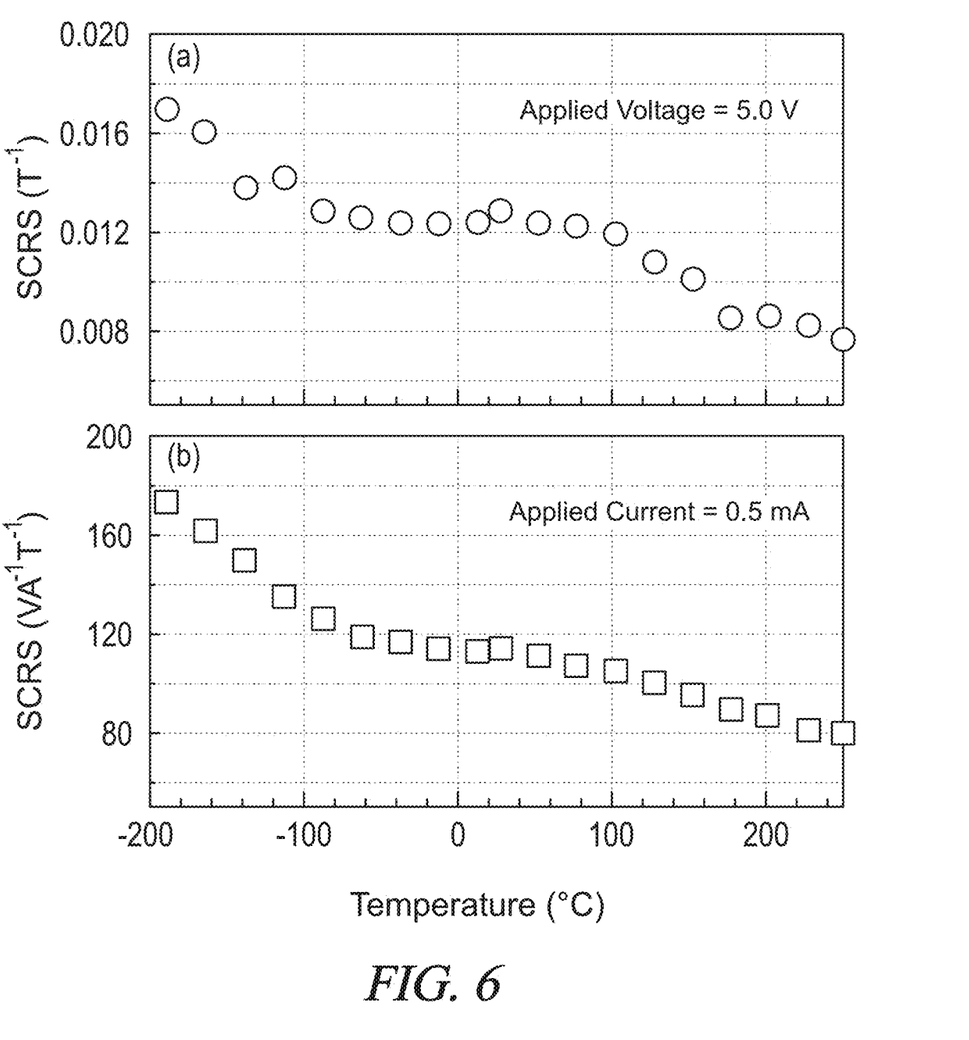
FIG. 6. (a) SVRS and (b) SCRS as a function of temperature.

Two measures of device efficiency are the supply voltage related sensitivity (SVRS), and supply current related sensitivity (SCRS). These values are calculated by dividing the absolute sensitivity, Eq. 6, by the bias voltage (SVRS) or by the bias current (SCRS), and they are shown in FIG. 6 as a function of temperature. The decreasing trend as temperature increases can be shown to be due to the changing electron drift velocity.

Figure 7:
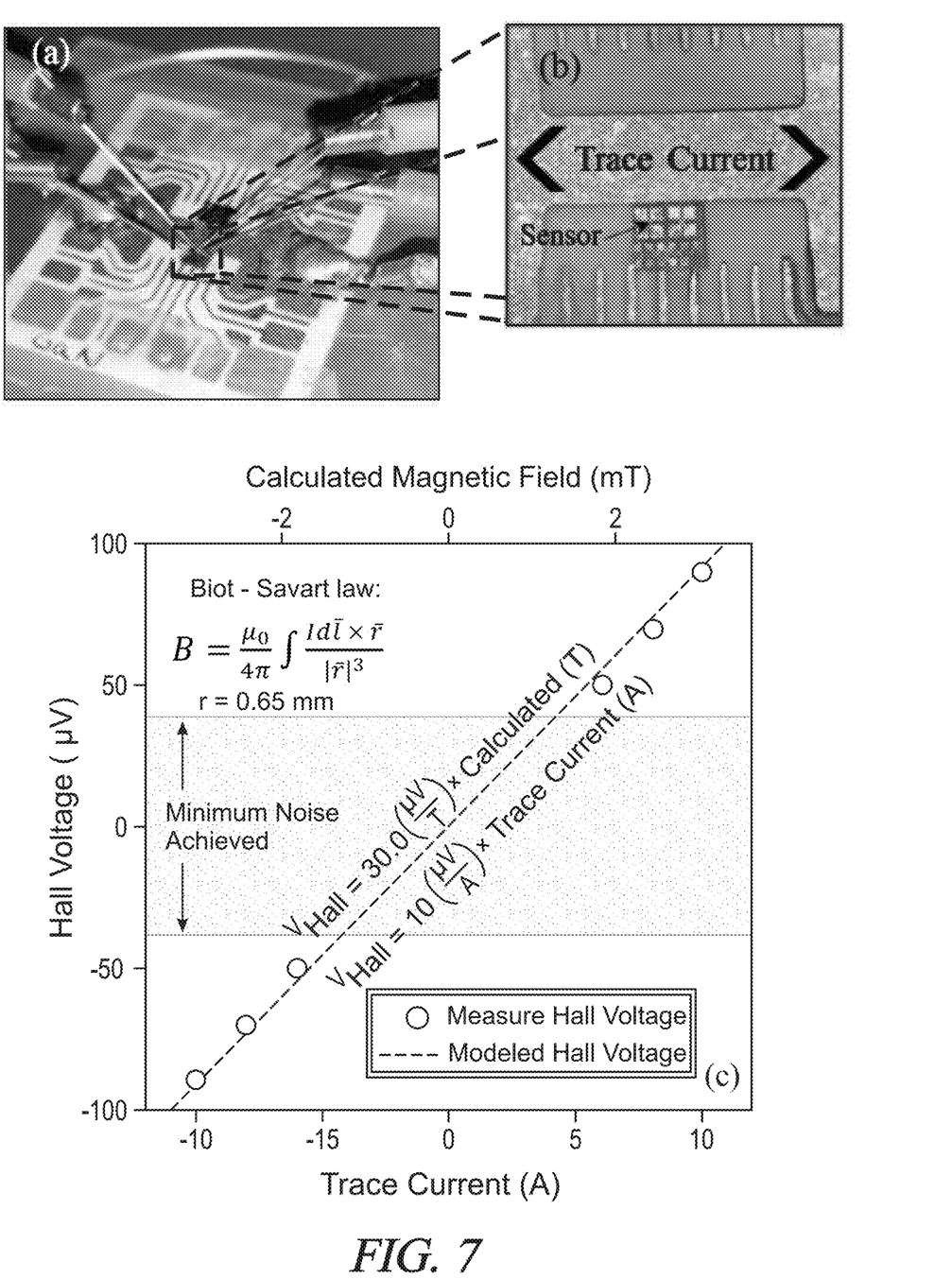
FIG. 7. (a) Sensor at 0.65 mm form a line carrying current; (b) enlarged view of Hall device and current trace; (c) Measured Hall voltage and modeled Hall voltage using Biot-Savart law and a sensitivity of 30 µV/T (µV—micro-Volt, Temperature).

The performance to measure the current in a copper trace at room temperature was undertaken for an embodiment of the present invention. The setup is shown in FIGS. 7a and 7b while the results are shown in FIG. 7c. With this very simple setup, without shielding or optimizing, this embodiment was able to detect a minimum line current of ~6 A with the device fixed at a distance of 0.65 mm from the line. This was done by measurement with and without a line current.

FIG. 2. (a) Sensor at 0.65 mm form a line carrying current; (b) enlarged view of Hall device and current trace; (c) Measured Hall voltage and modeled Hall voltage using Biot-Savart law and a sensitivity of 30 μV/T.

Understanding the difference between measuring a magnetic field sensitivity and a current detection sensitivity is important here, and a notable difference that distinguishes the present invention from that reported in other research. When the sensor is detecting a current, the magnetic field strength at the active area of the sensor is dependent on both the magnitude of current within the copper trace as well as the distance (r) the sensor is located from the copper trace as given by the Biot-Savart law, $$B = \frac{\mu_0}{4\pi} \int \frac{I d\vec{l} \times \vec{r}}{|\vec{r}|^2} \quad (7)$$

where $\mu_0$ is the permittivity of free space, I is the current through the trace, and $d\vec{l}$ is the length of an infinitesimal trace element.

When passing current through the trace as shown in FIG. 7c, the Hall voltage reversed sign when the line current direction was reversed as expected. A current detection sensitivity of 10 μV/A was measured while the device is located 0.65 mm from a copper trace. Furthermore, a trend line fitted to the measured data by using 0.65 mm as a constant and magnetic field sensitivity as the fitting parameter is also shown in FIG. 7c. The magnetic field sensitivity calculated from the linear fit was 30 μV/T. Additionally, the Hall voltages in FIG. 7c are also consistent with the data shown in FIG. 5. Noise within the test setup and distance between the line and sensor are the cause for limiting the least possible current detection limit at a 6 A line current.

Coupling multiple sensors together, using lock-in detection, or decreasing the distance between the sensor and line current will allow for a reduction in the current detection limit.

Offset Voltage Analysis and Temperature Measurement Capabilities of the Micro-Hall Device The sensors of the present invention are aimed primarily at sensing the current and temperature in high power applications. As a result, the geometry, sensitivity, offset voltage, and their temperature drift are important parameters that determine their performance.

For example, the offset voltage which is the Hall potential when the applied magnetic field may be set to zero. This parasitic voltage at zero field is potentially due to many issues, such as, non-uniform geometry, misalignment of contacts, material resistance, contacts, stress, and thickness. The offset is basically a voltage that adds to the Hall voltage during measurement and is strictly independent of the magnetic field in sign and magnitude. Measuring it and subtracting from the Hall voltage is straightforward but problematic to sensor function when turning off the magnetic field is not an option, and temperature changes and is unknown, as is the case for our application. Consequently, the offset voltage limits the ability of the sensor to detect low magnetic fields. Many attempts have been made at this problem. Among these are attempts that involve reduction of the offset voltage with external analog circuits, resistance bridges, or rotating contacts.

For an embodiment of the present invention, it has been determined that the offset voltage is related to voltage drop between contacts and can be removed without turning off the field.

For this embodiment, the approach begins with measurement of the voltage at the Hall contacts ($V_{out}$) which is composed of both the Hall voltage ($V_{Hall}$) and the offset voltage ($V_{offset}$).

$$V_{out}(B,T) = V_{Hall}(B,T) + V_{offset}(t) \tag{8}$$

Figure 8:
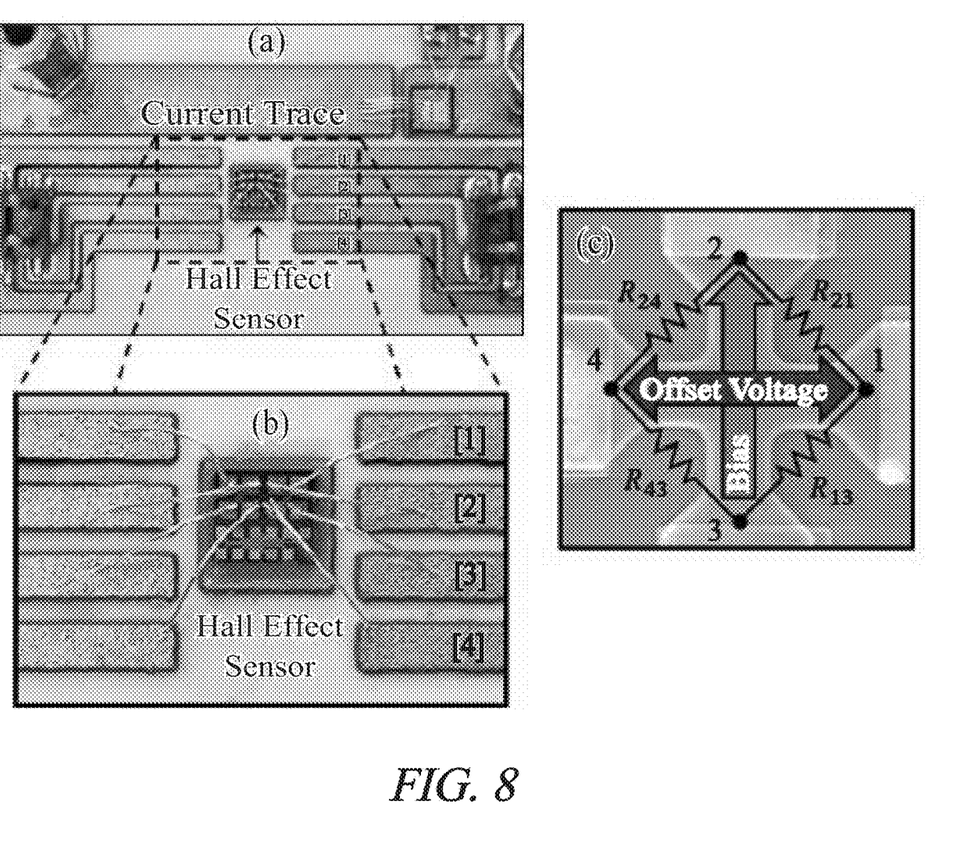
FIG. 8. General bridge model of a Hall sensor: (a) Test module and Hall sensor with contacts 1 through 4 used to apply voltage ($V_A$) and measure ($V_{out}$) and the voltage across each effective resistor; (b) enlarged view of the Hall effect device; (c) equivalent resistive circuit with contacts 1 through 4.

Here $V_{out}(B,T)$ and $V_{Hall}(B,T)$ are functions of local magnetic field and temperature, while $V_{offset}(T)$ is observed to be only a function of local temperature. The objective is to determine $V_{Hall}(B,T)$ and the $V_{offset}(T)$ in order to report and monitor nearby current and temperature. These issues can be discussed using the bridge circuit model of a Hall sensor, based on four contact resistances, as shown in FIG. 8.

Regardless of what the offset voltage is due to, it is assumed that the offset voltage can be defined as the difference in potential ($V_{21}-V_{24}$) or ($V_{43}-V_{13}$) with zero field as shown in Eqs. 9 and 10, respectively. This was checked by measuring this difference by averaging the two differences which were identical within measurement error. For comparison purposes, this measured average voltage is referred to as the indirect offset voltage and the actual measured output voltage with zero applied magnetic field as the direct offset voltage (Eq. 11). Referring to the circuit shown in FIG. 8c and using contact 2 as a reference, the indirect offset voltage at zero field can be written as $$V_{offset,indirect}(T) = V_{21}(T) - V_{24}(T). \tag{9}$$

At the same time, using contact 3 as a reference, the indirect offset voltage can be written as $$V_{offset,indirect}(T) = V_{43}(T) - V_{13}(T). \tag{10}$$

The direct offset can always be written as $$V_{offset,direct}(T) = V_{out}(B=0,T). \tag{11}$$

Figure 9:
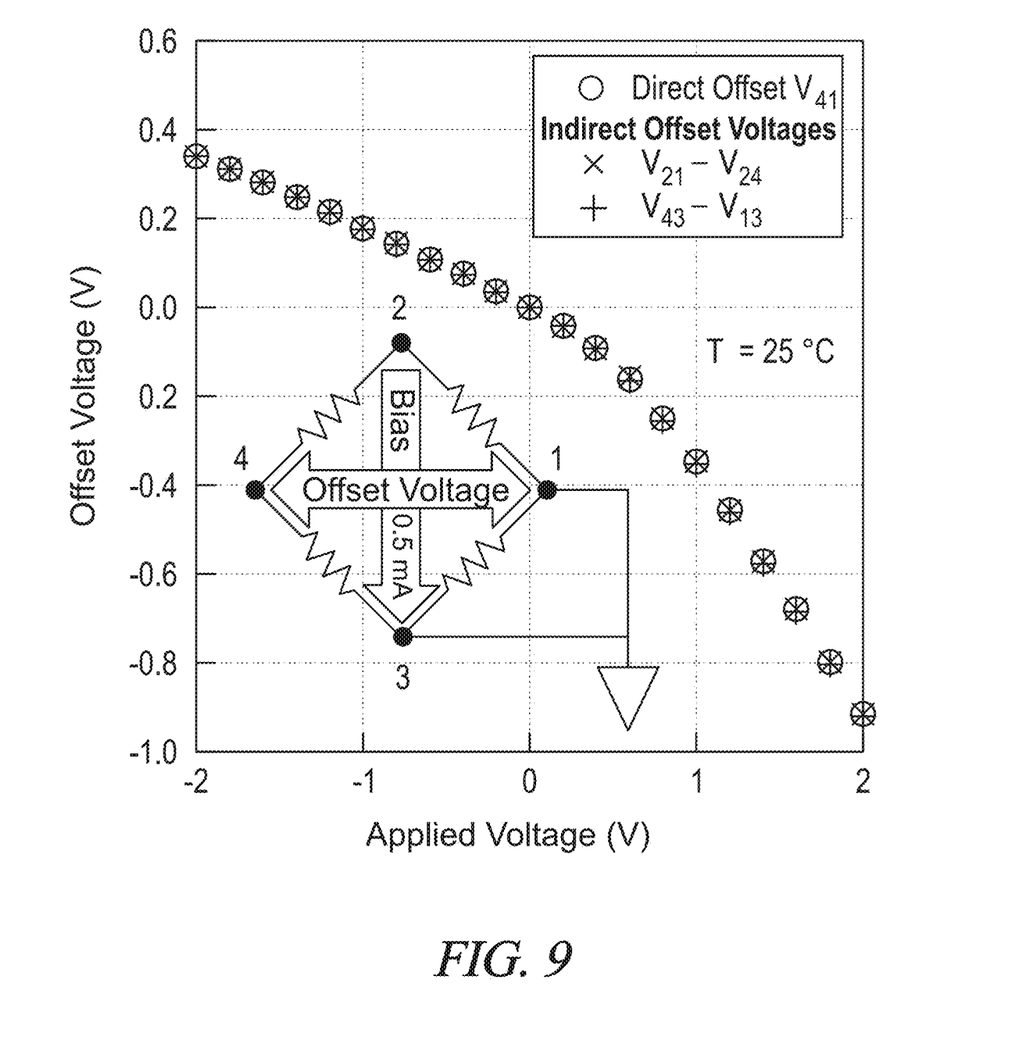
FIG. 9. Comparison between the direct offset voltage and the indirect offset voltage. The applied voltage is between contacts 2 and 3 while the direct offset voltage is measured between contacts 4 and 1. Data shows that both the direct and indirect offset voltages are identical.

However, in FIG. 9, the direct offset is the measured voltage across contacts 4 and 1. The applied voltage is between contacts 2 and 3 while the direct offset voltage is measured between contacts 4 and 1. Data shows that both the direct and indirect offset voltages are identical.

To compare the direct and indirect offset voltages, they were plotted in FIG. 9 and as a function of applied voltage. As expected, and within a small experimental error, the direct and indirect offset voltages are identical for two different arrangements of the sensor, i.e. using contacts 2 or 3 as the reference. These measured voltages were also identical when operated under current control. These measurements were taken at room temperature. In Eqs. 9-11, all measured voltages are a function of the local temperature.

As a practical matter, it is important to note that in measuring the offset voltage one can find either a small offset or large offset depending on grounding issues. For example, using a source and a voltmeter that are grounded at terminals 1 and 3 will short one contact resistor in the bridge, leaving V21 as the full applied potential and V24 about half the applied potential, resulting in a very large value of (V21−V24). On the other hand, the difference will be small if only terminal 1 is grounded.

Figure 10:
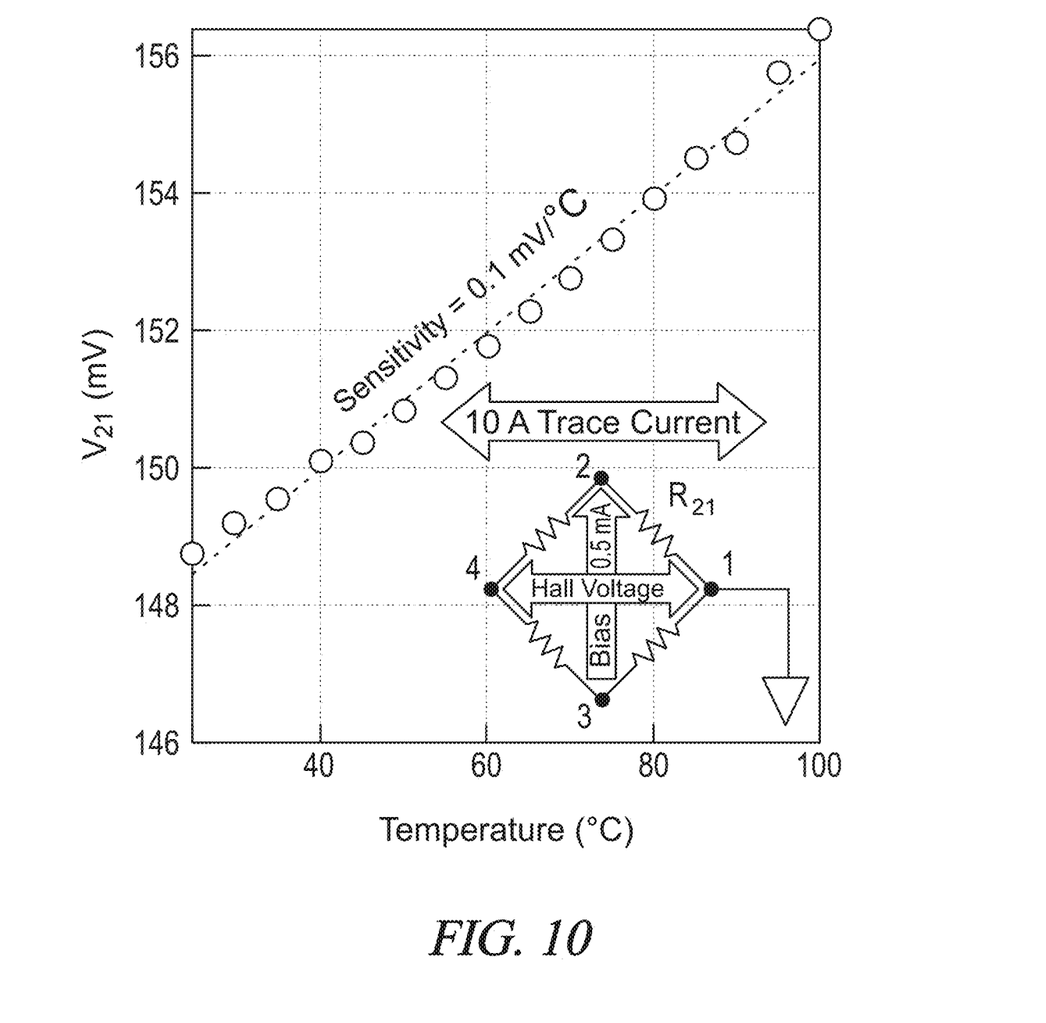
FIG. 10. Potential across terminals 1 and 2 as a function of temperature.

Given an understanding of the off-set voltage, if terminal 1 is grounded, V21 is independent of the Hall voltage during a measurement and therefore is used to determine temperature. FIG. 10 shows the temperature dependence of V21 which is then used as a reference to determine the sample temperature. With predetermined knowledge of the offset voltage at zero field as a function of temperature, once the temperature is determined from V21, the offset voltage is determined, and it can be subtracted from the measured potential difference between terminals 4 and 1 with an applied magnetic field.

In practice, this means that by monitoring and processing these potential differences, this approach will determine both the local magnetic field (and therefore line current) and local temperature in power electronic circuits without interrupting the line current. This approach will work particularly well, when the Hall sensor and power transistor are integrated on the same chip, which is our current research effort.

Figure 11:
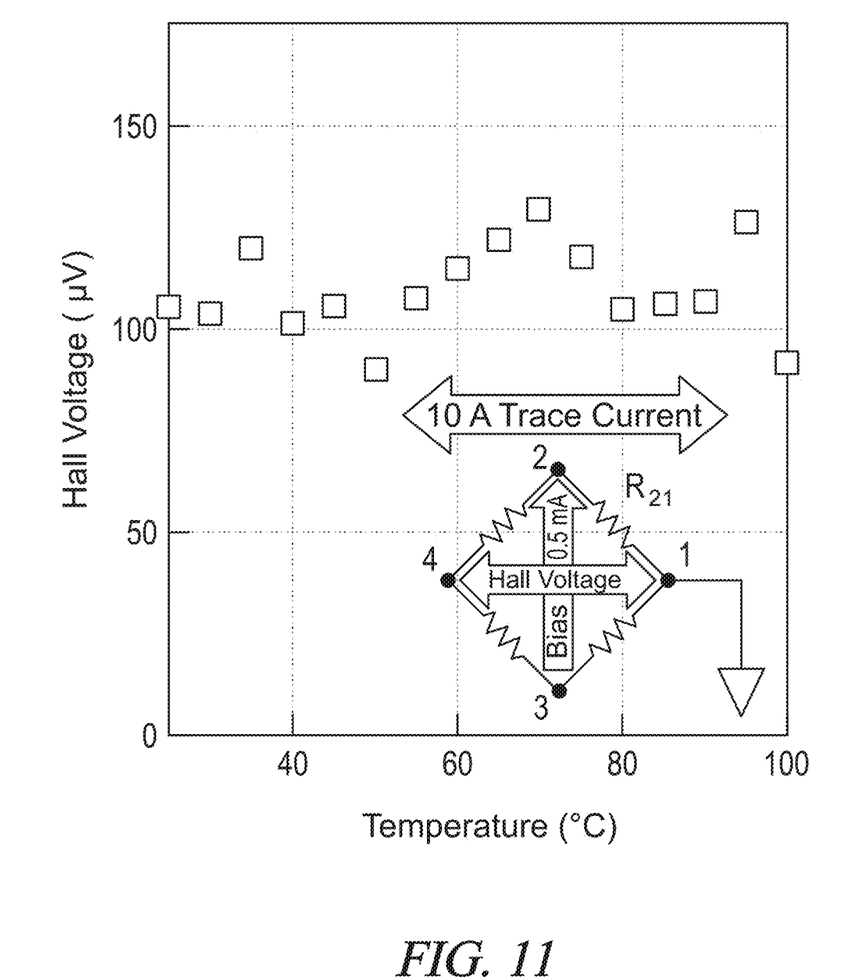
FIG. 11. The same value of Hall voltage is determined by switching on and off the magnetic field (B) and calculated by subtracting the predetermined offset potential at zero magnetic field at a given temperature from the potential measure across terminals 1 and 4 with a magnetic field.

FIG. 11 shows the Hall voltage determined determine two ways that give identical numbers. The first way is by switching the line current or magnetic field on-and-off. In this approach, the Hall voltage is determined by subtracting the off-set voltage at a given temperature form the potential measured between terminals 1 and 4 with a magnetic field on, at the determined temperature. The second way is to use the same measurements of the potential V1 to determine temperature and use the temperature to read off the offset voltage and subtract it from the measured potential between terminals 1 and 4 to get the very same value for Hall voltage using the same measurements.

FIG. 11. The same value of Hall voltage is determined by switching on-and-off the magnetic field (B) and calculated by subtracting the predetermined off-set potential at zero magnetic field at a given temperature from the potential measure across terminals 1 and 4 with a magnetic field.

The above description is for a specific fabrication process, however, the Hall device concept for simultaneous current and temperature measurement is true for a much broader choice of materials and fabrication technique.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiments, methods, and examples, but by all embodiments and methods within the scope and spirit of the disclosure.

In addition, to the above description, the materials attached hereto form part of the disclosure of this provisional patent application.

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A sensor comprising:
   AlGaN/GaN heterostructures fabricated into a single micro-Hall effect sensor including a set of bias terminals including a first bias terminal and a second bias terminal and a set of Hall voltage terminals including a first Hall voltage terminal and a second Hall voltage terminal,
   a bias applied across the set of bias terminals,
   a simultaneous Hall voltage measured across the set of Hall voltage terminals, and
   a simultaneous temperature measured between the set of bias terminals and the set of Hall voltage terminals.

2. The sensor of claim 1 wherein said sensor has at least a best performance temperature range of −183° C. (Degree Celsius) and 252° C.

3. The sensor of claim 1 wherein said sensor are linearly dependent on magnetic field and temperature throughout.

4. The sensor of claim 1 wherein said sensor has a high room temperature mobility for the related material, which is in the range of twelve hundred centimeters squared per volt second to twenty two hundred centimeters squared per volt second and results in a least a best performance magnetic field sensitivity of one hundred and thirteen volts per amp per temperature, which only decreased to eighty volts per amp per temperature at two hundred and two degrees celcius.

5. The sensor of claim 1 wherein said sensor has the ability to measure temperature while at the same time measuring B-field magnitudes.

6. The sensor of claim 1 wherein said sensor has the ability to decouple temperature and current signatures.

7. The sensor of claim 1 wherein said sensor has the ability to follow the Hall voltage-temperature relationship under constant magnetic field and bias.

8. The sensor of claim 1 wherein said sensor has a sensitivity between 30 microvolts per temperature and 60 microvolts per temperature at approximately twenty degrees celcius.

9. The sensor of claim 1 wherein offset voltage is related to the voltage drop between contacts and can be removed without turning off the field.

10. The sensor of claim 1 wherein said sensor allow for direct-current/alternating-current current detection while at the same time achieving circuit isolation.

11. The sensor of claim 1 wherein said sensor separate the offset voltage from the Hall voltage.

12. The sensor of claim 1 wherein said sensor measure temperature and current simultaneously.

13. The sensor of claim 1 wherein said sensor function as a pressure sensor.

14. The sensor of claim 1 wherein said sensor function as a simultaneous current, pressure, and temperature sensor.

15. The sensor of claim 1 wherein said sensor function a feedback system to protect or enhance electronic circuits or devices and inverters/convertors.

16. The sensor of claim 1 wherein said sensor separates the offset voltage from the Hall voltage using two distinct voltage measurements and their predetermined measurements as a function of temperature.

17. The sensor of claim 16 wherein removing the offset voltage allows for the simultaneous and simple measurement of both current and temperature.

18. A sensor comprising: GaN/Al$_{0.20}$Ga$_{0.80}$N/GaN fabricated into a single micro-Hall effect sensor including a set of bias terminals including a first bias terminal and a second bias terminal and a set of Hall voltage terminals including a first Hall voltage terminal and a second Hall voltage terminal,
   a bias applied across the set of bias terminals,
   a simultaneous Hall voltage measured across the set of Hall voltage terminals, and
   a simultaneous temperature measured between the set of bias terminals and the set of Hall voltage terminals.

19. The sensor of claim 18 wherein said sensor has at least a best performance temperature range of −183° C. (Degree Celsius) and 252° C.

20. The sensor of claim 18 wherein said sensor are linearly dependent on magnetic field and temperature throughout.

21. The sensor of claim 18 wherein said sensor has a high room temperature mobility for the related material, which is in the range of twelve hundred centimeters squared per volt second to twenty two hundred centimeters squared per volt second and results in a least a best performance magnetic field sensitivity of one hundred and thirteen volts per amp per temperature, which only decreased to eighty volts per amp per temperature at two hundred and two degrees celcius.

22. The sensor claim 18 wherein said sensor has the ability to measure temperature while at the same time measuring B-field magnitudes.

23. The sensor of claim 18 wherein said sensor has the ability to decouple temperature and current signatures.

24. The sensor of claim 18 wherein said sensor has the ability to follow the Hall voltage-temperature relationship under constant magnetic field and bias.

25. The sensor of claim 18 wherein said sensor has a sensitivity between thirty microvolts per temperature and sixty microvolts per temperature at approximately twenty degrees celcius.

26. The sensor of claim 18 wherein offset voltage is related to the voltage drop between contacts and can be removed without turning off the field.

27. The sensor of claim 18 wherein said sensor allow for direct-current/alternating-current current detection while at the same time achieving circuit isolation.

28. The sensor of claim 18 wherein said sensor separate the offset voltage from the Hall voltage.

29. The sensor of claim 18 wherein said sensor function as a pressure sensor.

30. The sensor of claim 18 wherein said sensor function as a simultaneous current, pressure, and temperature sensor.

31. The sensor of claim 18 wherein said sensor function a feedback system to protect or enhance electronic circuits or devices and inverter/convertors.

32. The sensor of claim 18 wherein said sensor separates the offset voltage from the Hall voltage using two distinct voltage measurements and their predetermined measurements as a function of temperature.

33. The sensor of claim 26 wherein removing the offset voltage allows for the simultaneous and simple measurement of both current and temperature.

* * * * *